(12) United States Patent
Khosravani et al.

(10) Patent No.: US 10,878,139 B2
(45) Date of Patent: Dec. 29, 2020

(54) COMPOSITE JOINT OPTIMIZATION

(71) Applicant: The Boeing Company, Chicago, IL (US)

(72) Inventors: Shahriar Khosravani, Mukilteo, WA (US); Omid B. Nakhjavani, Kirkland, WA (US); Vincent Bell, Mukilteo, WA (US); Laine Tennyson, Renton, WA (US); Farhad Dabiri, Everett, WA (US)

(73) Assignee: The Boeing Company, Chicago, IL (US)

( * ) Notice: Subject to any disclaimer, the term of this patent is extended or adjusted under 35 U.S.C. 154(b) by 361 days.

(21) Appl. No.: 14/809,336

(22) Filed: Jul. 27, 2015

(65) Prior Publication Data
US 2017/0032077 A1    Feb. 2, 2017

(51) Int. Cl.
*G06F 30/15*    (2020.01)
*B64F 5/00*    (2017.01)
(Continued)

(52) U.S. Cl.
CPC .......... *G06F 30/15* (2020.01); *B64D 45/02* (2013.01); *B64F 5/00* (2013.01); *B64F 5/60* (2017.01);
(Continued)

(58) Field of Classification Search
CPC .. G06F 17/5095; G06F 17/11; G06F 17/5086; B64F 5/60; B64F 5/00; B64D 45/02
See application file for complete search history.

(56) References Cited

U.S. PATENT DOCUMENTS 7,010,472 B1 * 3/2006 Vasey-Glandon ...... G06F 17/50
700/97
8,645,110 B1 * 2/2014 Weckner ............ G06F 17/5009
428/36.91
(Continued)

FOREIGN PATENT DOCUMENTS

EP    2894580 A1 *  10/2014    ............ G06F 17/50
EP    2894580        7/2015

OTHER PUBLICATIONS

Ed Rupke, Lightning Direct Effects Handbook, Report Reference No. AGATE-WP3.1-031027-043-Design Guideline, Mar. 1, 2002. p. 1-119.*

(Continued)

*Primary Examiner* — Rehana Perveen
*Assistant Examiner* — Chuen-Meei Gan
(74) *Attorney, Agent, or Firm* — Perman & Green LLP

(57) ABSTRACT

A method including receiving a joint parameter for a joint between at least two composite structural components, a ply stackup for each of the at least two composite structural components and an electromagnetic effect parameter in a controller, iteratively processing with the controller, the joint parameter and the ply stackup and outputting an optimized joint parameter based on at least a convergence of an electromagnetic effect resistance of the joint and the at least two composite structural components, and changing, with the controller, a value of one or more of the joint parameters and the ply stackup during the iterative processing to reach the convergence of the electromagnetic effect resistance.

21 Claims, 8 Drawing Sheets

(51) Int. Cl.
  *B64F 5/60* (2017.01)
  *B64D 45/02* (2006.01)
  *G06F 30/17* (2020.01)
  *G06F 17/11* (2006.01)
  *F16B 5/06* (2006.01)

(52) U.S. Cl.
  CPC .............. *G06F 17/11* (2013.01); *G06F 30/17* (2020.01); *F16B 5/0642* (2013.01)

(56) References Cited

U.S. PATENT DOCUMENTS

| | | | |
|---|---|---|---|
| 2004/0246651 A1* | 12/2004 | De La Fuente De Ana | B29C 70/885 361/215 |
| 2008/0103740 A1* | 5/2008 | Meizoso Latova | G06F 17/5018 703/7 |
| 2010/0223029 A1* | 9/2010 | Krog | G06F 17/50 703/1 |
| 2012/0126054 A1* | 5/2012 | Sequeiros Murciano | B64D 45/02 244/1 A |
| 2013/0330503 A1* | 12/2013 | Kismarton | B32B 5/12 428/113 |
| 2015/0337885 A1* | 11/2015 | Whitlock | F16B 35/048 411/411 |
| 2016/0047734 A1* | 2/2016 | Mills | G01N 15/1434 73/19.07 |
| 2016/0125107 A1* | 5/2016 | Druckman | G06F 17/5018 703/2 |
| 2016/0214735 A1* | 7/2016 | Garcia | B64D 45/02 |
| 2017/0098930 A1* | 4/2017 | Le | H02G 13/80 |

OTHER PUBLICATIONS

Simon Evan et al, Lightning Strike Protection of Aircraft Structural Joints, 2014 International Conference on Lightning Protection, Shanghai, China, 2014, p. 1952-1959.*
Chemartin et al, Direct Effects of Lightning on Aircraft Structure: Analysis of the Thermal, Electrical and Mechanical Constraints, Lightning Hazards to Aircraft and Launchers, Journal Aerospace Lab Issue 5—Dec. 2012 p. 1-15.*
Xiang Ma et al, Design of a hybrid carbon fibre/carbon nanotube composite for enhanced lightning strike resistance AerospaceScienceandTechnology47(2015)367-377 (Year: 2015).*
Mulazimoglu, H. and Haylock, L., "The Effect of Machining-Induced Micro Texture on Lightning Current Arcing between Fasteners and Composite Structure," SAE Int. J. Aerosp. 2(1):232-240, 2010, (Year: 2010).*
I. Revel, G. Peres, B. Lepetit, F. L. Andrivet. "Understanding of sparking phenomenon in CFRP assemblies" International conference on lightning and static electricity 2009 (Year: 2009).*
European Search Report, European Application No. 16180526, dated Dec. 16, 2016.

* cited by examiner

COMPOSITE JOINT OPTIMIZATION

BACKGROUND

Designing a joint of an aircraft, such as on the composite skin of the aircraft, is generally performed by first designing the structural aspects of the joint which include fastener location and the composition of the aircraft skins. The structural design is then submitted for the electromagnetic effect analysis, such as with respect to a lightning strike of the aircraft. The electromagnetic effect analysis is generally performed through testing of the structural design. A determination is made if the structural design meets Federal Aviation Administration (FAA) requirements. Where the structural design does not meet FAA requirements for both structural integrity and electromagnetic effects the joint is redesigned structurally and then retested to determine the electromagnetic effect performance of the joint. This process repeats itself until the structural design of the joint satisfies both the structural requirements and the electromagnetic effect requirements of the FAA.

SUMMARY

A method comprising receiving a joint parameter for a joint between at least two composite structural components, a ply stackup for each of the at least two composite structural components and an electromagnetic effect parameter in a controller; iteratively processing with the controller, the joint parameter and the ply stackup and outputting an optimized joint parameter based on at least a convergence of an electromagnetic effect resistance of the joint and the at least two composite structural components; and changing, with the controller, a value of one or more of the joint parameter and the ply stackup during the iterative processing to reach the convergence of the electromagnetic effect resistance.

A method comprising receiving a joint parameter for a joint between at least two composite structural components, a load profile for the joint and an electromagnetic effect parameter in a controller; determining with the controller, a ply stackup for each of the at least two composite structural components; determining with the controller, an electromagnetic effect resistance of the joint and the at least two composite structural components; iteratively processing with the controller, the joint parameter and the ply stackup and outputting an optimized joint parameter based on at least a convergence of the electromagnetic effect resistance; and changing with the controller, a value of one or more of the joint parameter and the ply stackup during the iterative processing to reach the convergence of at least the electromagnetic effect resistance.

A computer program product having instructions stored on a non-transitory computer-readable storage medium which, when executed, configure a controller to receive joint parameters for a joint between at least two composite structural components; receive a ply stackup for each of the at least two composite structural components; receive electromagnetic effect parameters; iteratively process the joint parameters, the ply stackup and the electromagnetic effect parameters and output optimized joint parameters based on at least a convergence of the electromagnetic effect parameters; and change a value of one or more of the joint parameters and the ply stackup during the iterative processing to reach the convergence of the electromagnetic effect parameters.

An aircraft comprising: a first composite structural component; a second composite structural component; and a plurality of fasteners joining the first composite structural component to the second composite structural component at a joint, an arrangement of the plurality of fasteners relative to each other being determined by receiving a joint parameter for the joint between the first and second composite structural components, a ply stackup for each of the first and second composite structural components and an electromagnetic effect parameter in a controller; iteratively processing with the controller, the joint parameter and the ply stackup and outputting an optimized joint parameter based on at least a convergence of an electromagnetic effect resistance of the joint and the at least two composite structural components; and changing, with the controller, a value of one or more of the joint parameter and the ply stackup during the iterative processing to reach the convergence of the electromagnetic effect resistance.

BRIEF DESCRIPTION OF THE DRAWINGS

Figure 1:
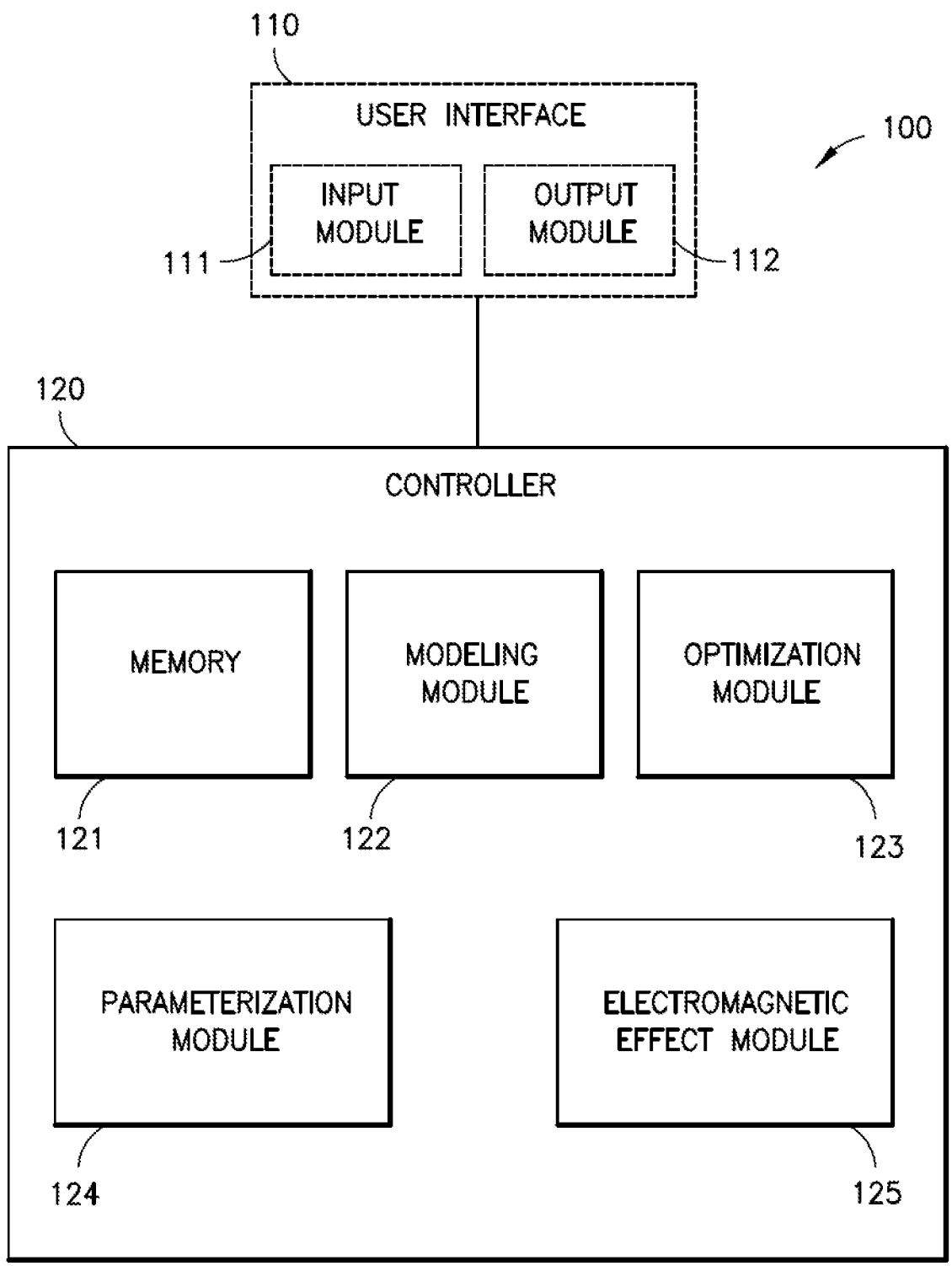
Figure 2:
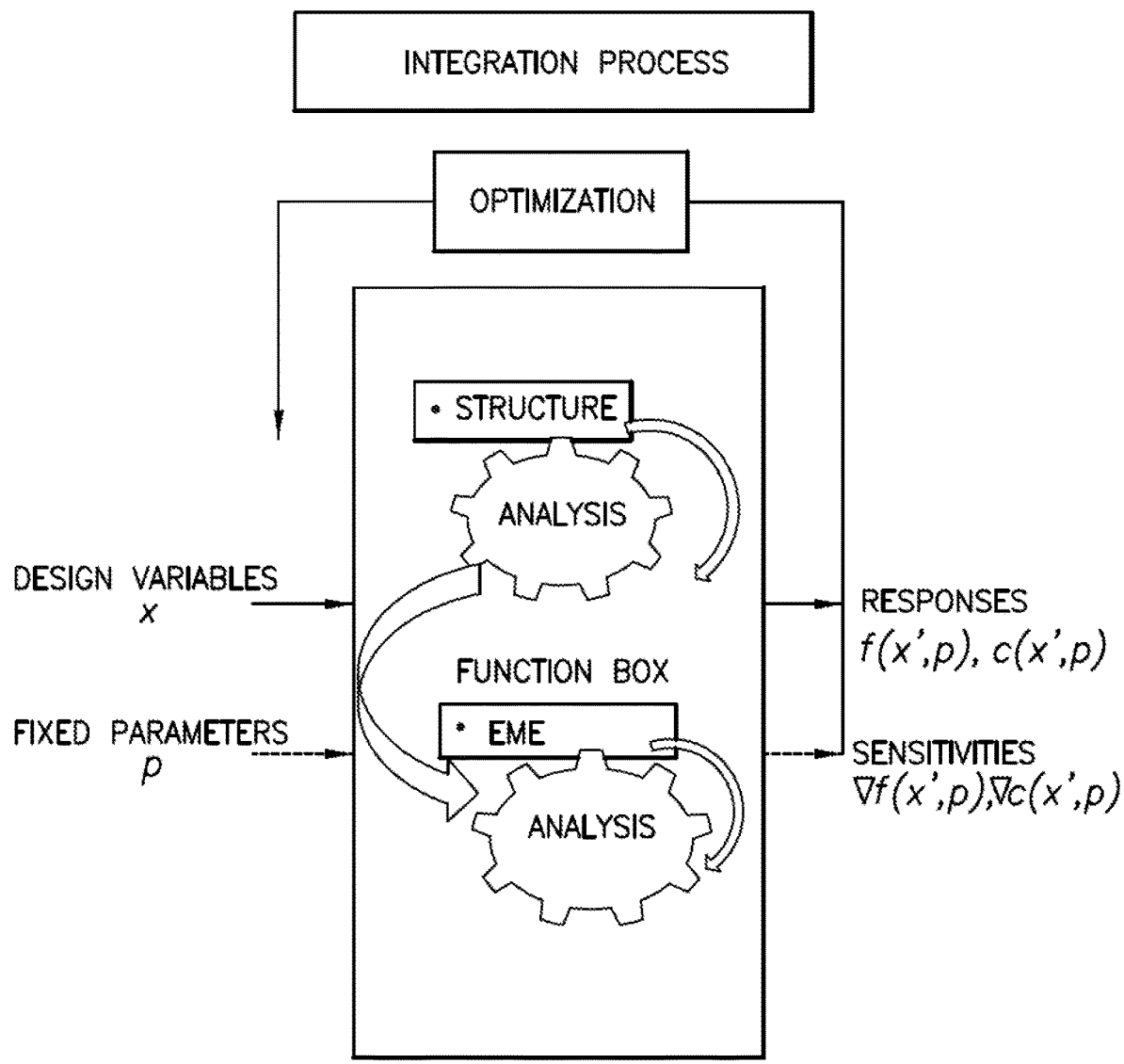
Figure 3A:
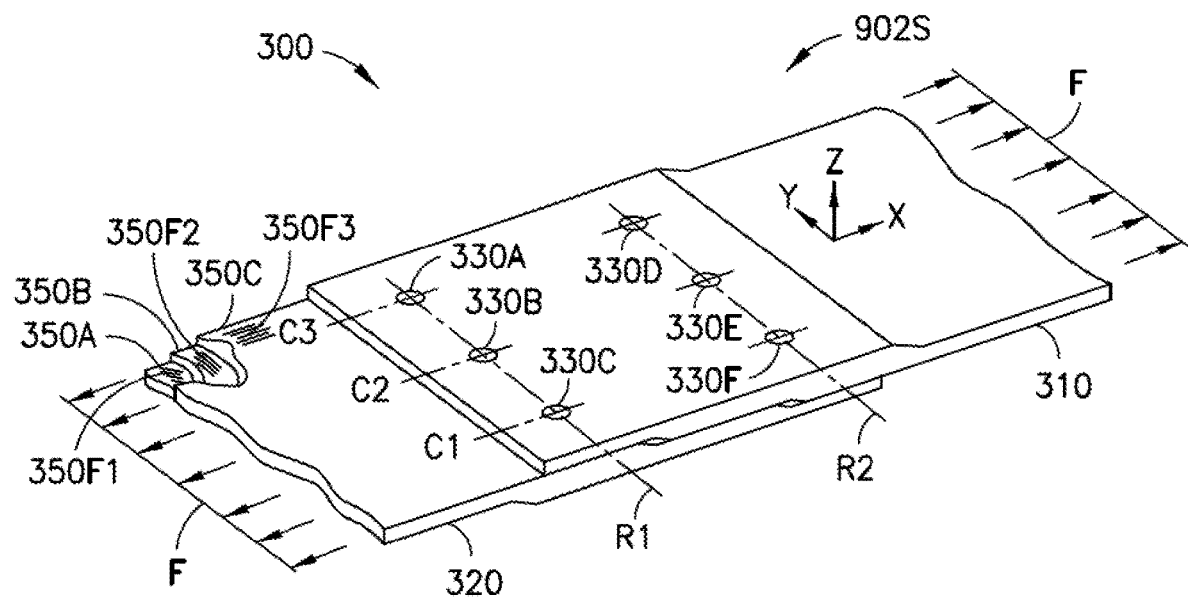
Figure 3B:
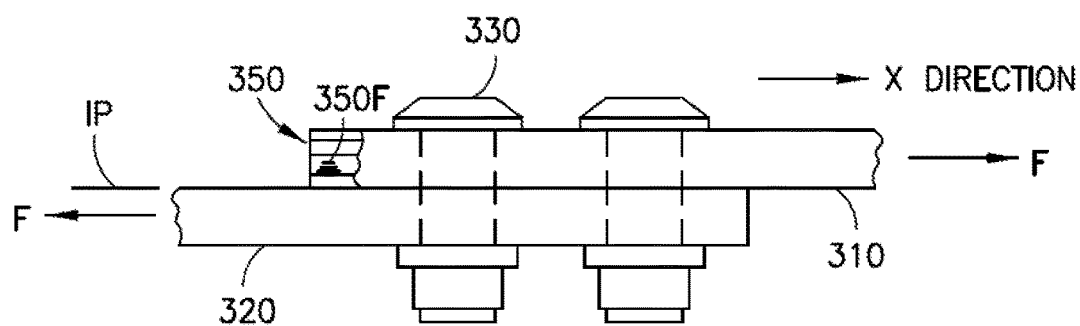
Figure 4:
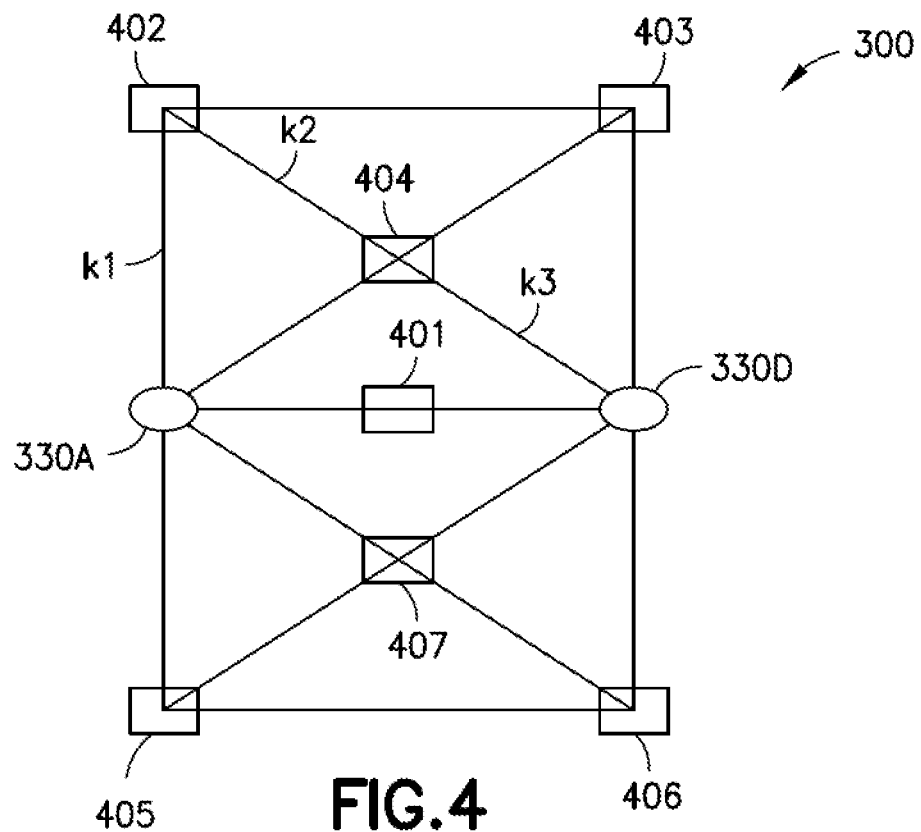
Figure 5:
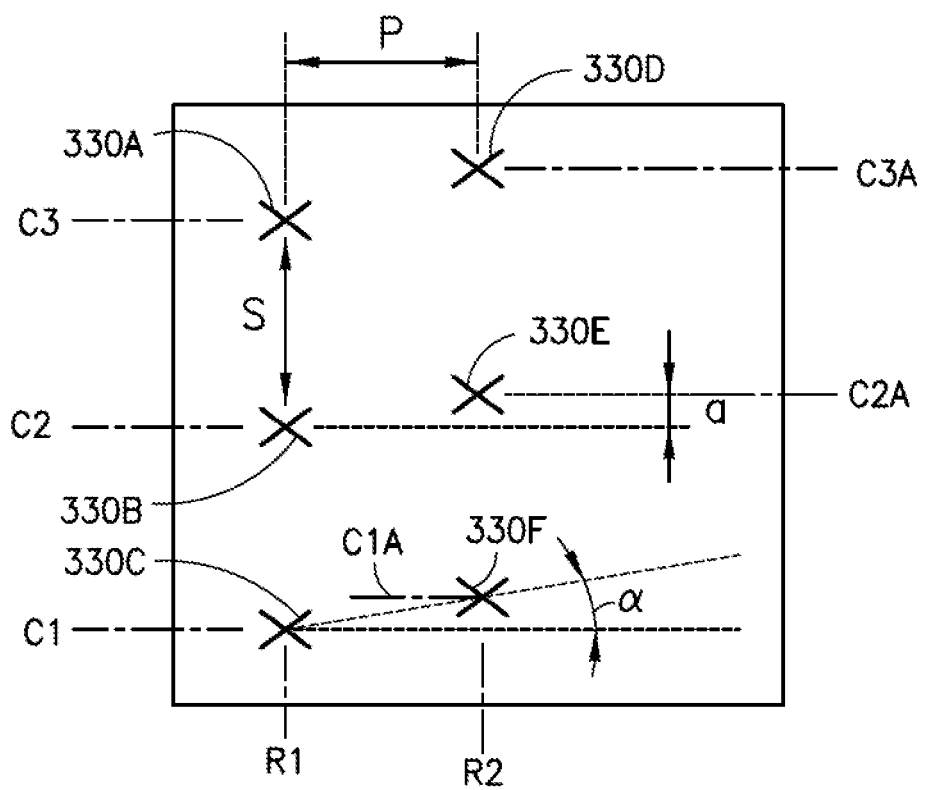
Figure 6:
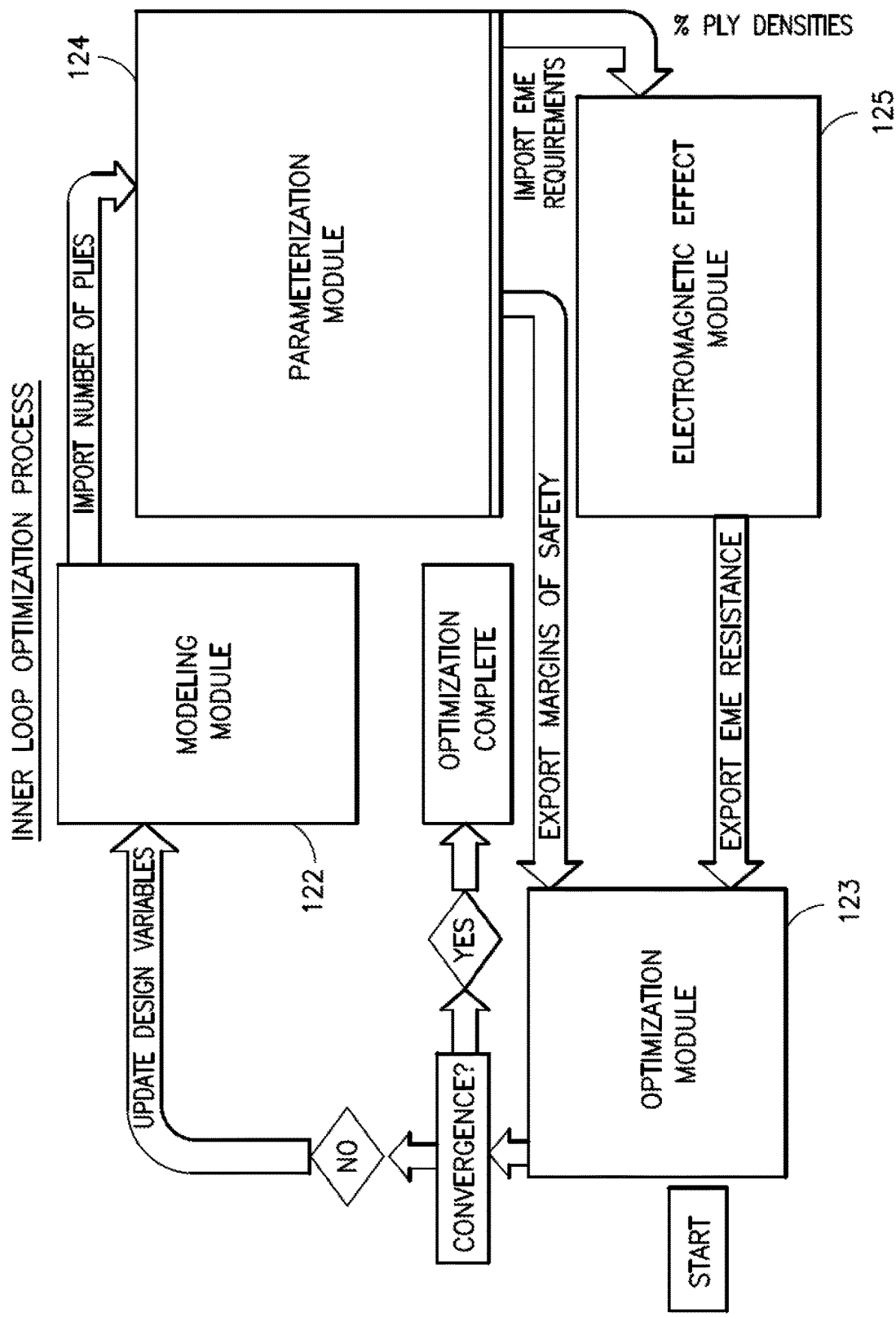
Figure 7:
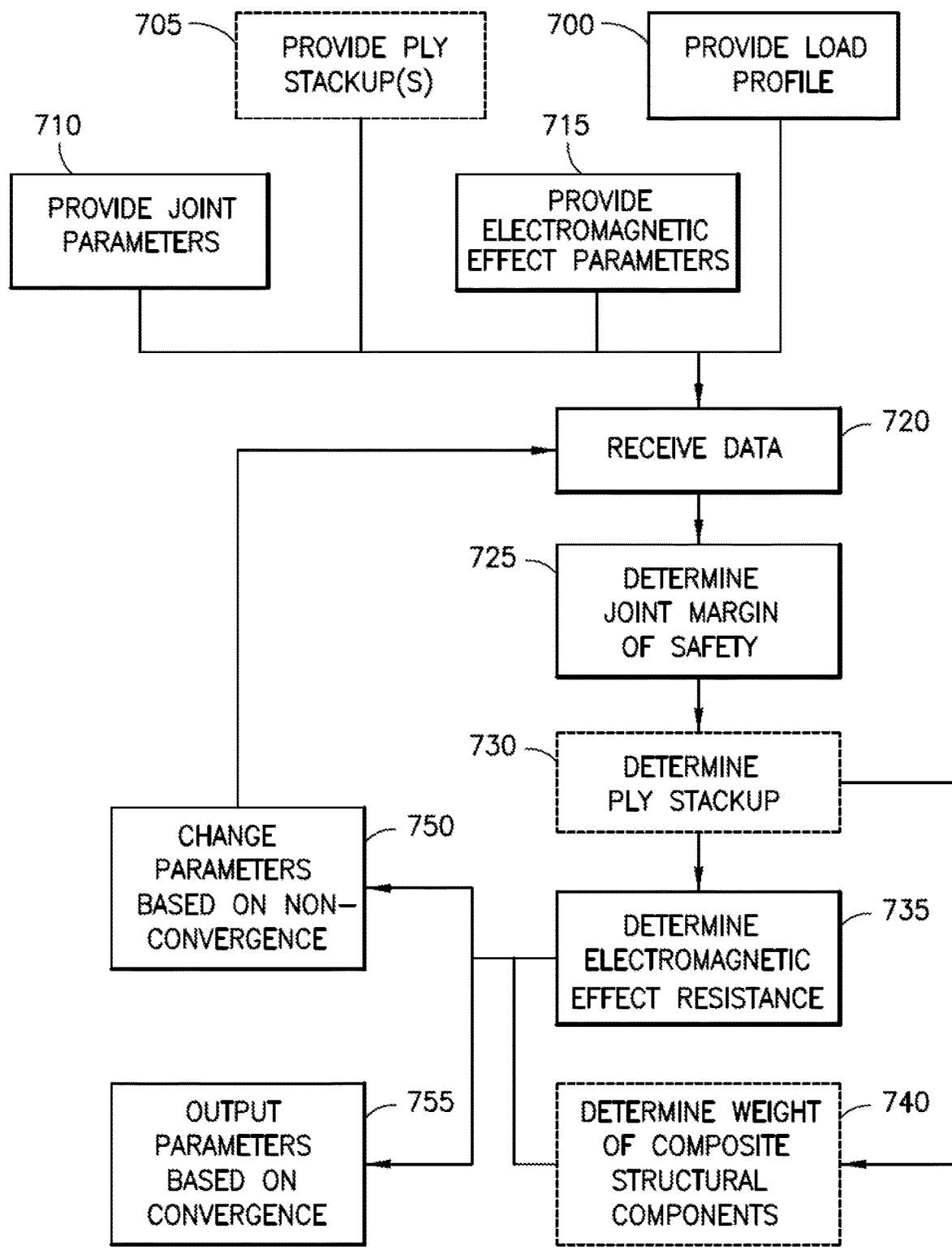
Figure 8:
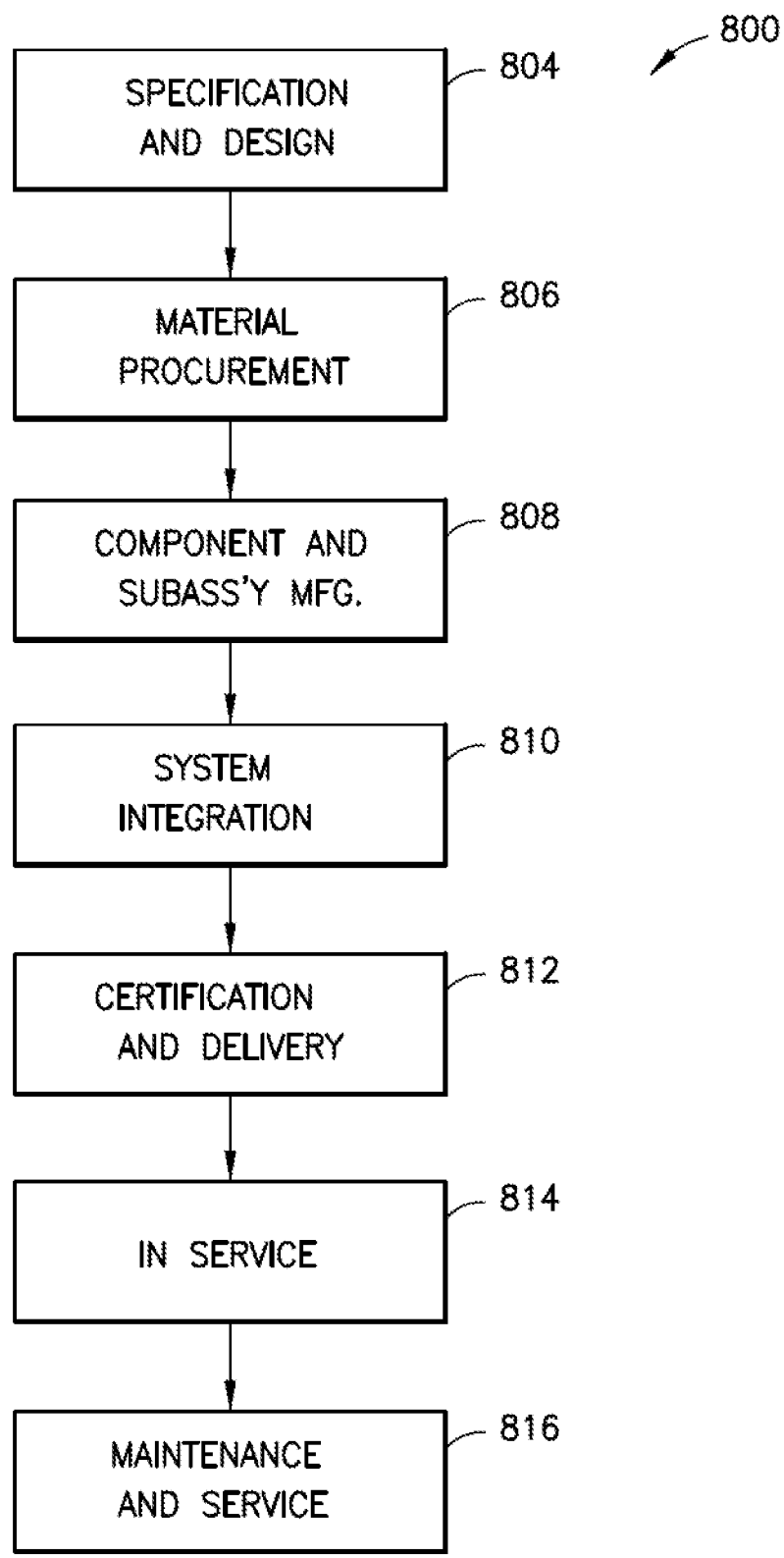
Figure 9:
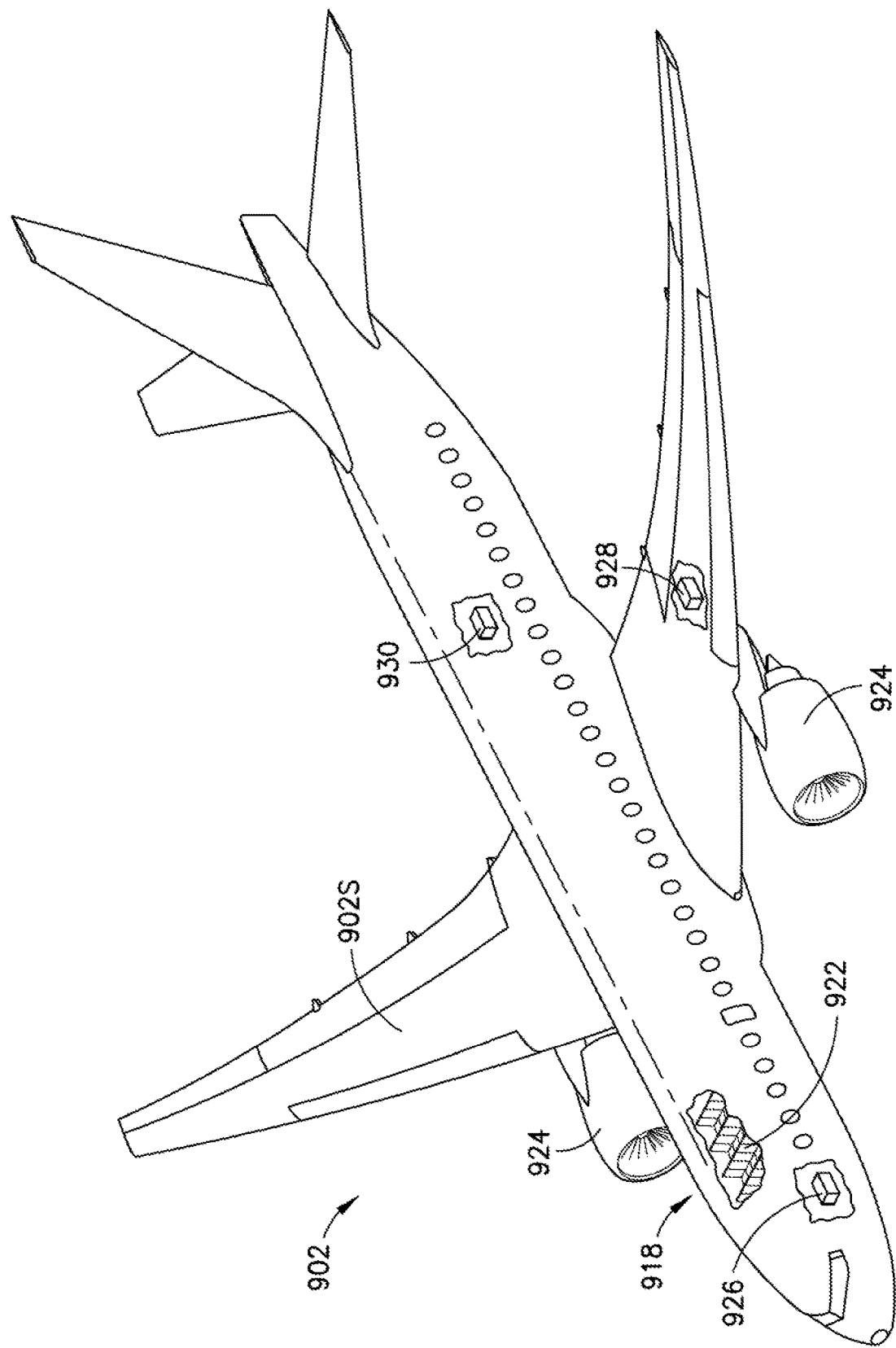

Having thus described examples of the disclosure in general terms, reference will now be made to the accompanying drawings, which are not necessarily drawn to scale, and wherein like reference characters designate the same or similar parts throughout the several views, and wherein:

FIG. 1 is a block diagram of a joint optimization system, according to one aspect of the present disclosure;

FIG. 2 is a diagrammatic representation of a joint optimization process, according to one aspect of the present disclosure;

FIGS. 3A and 3B are diagrammatic representations of an exemplary joint, according to one aspect of the present disclosure;

FIG. 4 is a diagrammatic representation of exemplary electrical resistance paths between fasteners of a joint, according to one aspect of the present disclosure;

FIG. 5 is a diagrammatic representations of an exemplary fastener arrangement of a joint, according to one aspect of the present disclosure;

FIG. 6 is a diagrammatic representation of a joint optimization process, according to one aspect of the present disclosure;

FIG. 7 is a flow diagram of joint optimization process, according to one aspect of the present disclosure;

FIG. 8 is a flow diagram of aircraft production and service methodology; and FIG. 9 is a diagrammatic representation of an aircraft including distributed vehicle systems.

In the block diagram(s) referred to above, solid lines, if any, connecting various elements and/or components may represent mechanical, electrical, fluid, optical, electromagnetic and other couplings and/or combinations thereof. As used herein, "coupled" means associated directly as well as indirectly. For example, a member A may be directly associated with a member B, or may be indirectly associated therewith, e.g., via another member C. Couplings other than those depicted in the block diagrams may also exist. Dashed lines, if any, connecting the various elements and/or components represent couplings similar in function and purpose to those represented by solid lines; however, couplings represented by the dashed lines may either be selectively provided or may relate to alternative or optional aspects of the disclosure. Likewise, elements and/or components, if any, represented with dashed lines, indicate alternative or optional aspects of the disclosure. Environmental elements, if any, are represented with dotted lines.

In the block diagram(s) referred to above, the blocks may also represent operations and/or portions thereof. Lines connecting the various blocks do not imply any particular order or dependency of the operations or portions thereof.

DETAILED DESCRIPTION

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Reference herein to "one example" or "one aspect" means that one or more feature, structure, or characteristic described in connection with the example or aspect is included in at least one implementation. The phrase "one example" or "one aspect" in various places in the specification may or may not be referring to the same example or aspect.

Unless otherwise indicated, the terms "first," "second," "third," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

The aspects of the present disclosure facilitate integrated analysis between multiple design disciplines. For example, the aspects of the disclosed embodiment combine electromagnetic effect and structural design disciplines to optimize the design process with respect to both structural design requirements and electromagnetic effect requirements. The aspects of the present disclosure optimize the design process and provide for one or more of a reduction of weight of the structure of, for example an aircraft or other vehicle, and a reduction of the effective resistance or strain energy of the structure with respect to electromagnetic effects so that electrical current, such as from a lightning strike, travels along the composite skin of the aircraft on a predetermined path that is defined by, for example, the fasteners provided for securing the structural components of the composite skin to each other and/or the airframe.

Referring to FIG. 1, a joint optimization system 100 is illustrated in accordance with aspects of the present disclosure. In one aspect the joint optimization system includes a controller 120 that is coupled to a user interface 110. In one aspect, the controller 120 includes a memory, a modelling module 122, a parameterization module 124, an electromagnetic effect module 125 and an optimization module 123. As will be described below, the controller 120 is configured to provide for the design of an aircraft joint with respect to both structural requirements and electromagnetic effect requirements. It is noted that the aspects of the present disclosure are described with respect to a joint between two components of the composite skin 902S (FIG. 9) of an aircraft 902 (FIG. 9), such as on the wing, however in other aspects the present disclosure may be applied to any structure that is to comply with predetermined electromagnetic effect requirements. In one aspect, the memory 121 is a non-transitory computer readable storage medium that includes instructions which, when executed, configure the controller to perform the aspects of the present disclosure described herein. In one aspect, a computer program product includes the instructions stored in the memory 121 which, when executed, configure the controller to perform the aspects of the present disclosure described herein. In one aspect, the user interface 110 includes an input module 111 and an output module 112. The input module 111 includes any suitable device that allows for a user input of joint design parameters to the controller 110. In one aspect, the input module 111 is one or more of a keyboard, mouse or touchscreen. The output module 112 includes any suitable device that allows for displaying information, such as the results of the optimization analysis described herein, to a user. In one aspect the output module 112 is a graphical display.

Referring to FIGS. 2, 3A and 3B, the controller 120 is configured to optimize the design of a joint 300 to, for example, one or more of minimize a weight of a composite structure and minimize the effective resistance of the structure. For exemplary purposes, in one aspect the composite structure, such as the aircraft skin 902S (see also FIG. 9), includes the joint 300 between two structural components 310, 320 of the skin 902S where the joint 300 includes one or more fasteners 330 that pass through and secure the structural components 310, 320 together. In other aspects the joint 300 is between more than two structural components. In one aspect, each of the structural components 310, 320 is a composite structure having a layup that includes one or more layers or plies 350 of composite material stacked one on top of the other so that the fibers 350F of the composite material of each ply is oriented in a predetermined direction relative to the fibers 350F of the other plies. For example, the composite material of each ply 350 is arranged so that the fibers 350F are oriented at an angle of 0°, 90°, +45° or −45°. For exemplary purposes, FIG. 3A illustrates the structural components 320 as having three plies 350A, 350B, 350C where the fibers 350F1 of ply 350A are arranged at an angle of about +45° with respect to the X axis of the joint 300, the fibers 350F2 of ply 350 are arranged at an angle of about 90° with respect to the X axis of the joint 300 and the fibers 350F3 of the ply 350C are arranged at an angle of about 0° with respect to the X axis of the joint 300. A percent ply density is defined as the percentage of the plies having a predetermined orientation. For example, if there are four plies where the fibers of two of the plies have a 0° orientation and the fibers of the other two plies have orientations of +45° and 90° respectively the percent ply density of the plies having fibers arranged at 0° is 50%, the percent ply density of the plies having fibers arranged at +45° is 25% and the percent ply density of the plies having fibers arranged at 90° is 25%. The plies of structural component 310 are, in one aspect, have a mirrored arrangement to the plies of the structural component 320 so that the plies of each structural component are symmetrical, along the Z axis, about the interface of the two structural components 310, 320 (e.g. an interface plane IP of the joint 300). It is noted that the X, Y and Z axis illustrated in FIG. 3A is for exemplary purposes only and the joint 300 is, in other aspects, oriented along any suitable spatial coordinate system.

The fasteners 330 of the joint 300 are arranged in, for example, rows and columns that are arranged relative to, for example, the X and Y axes of the joint 300. For example, the joint 300 in this aspect includes six fasteners 330A, 330B, 330C, 330C, 330D, 330E, 330F arranged along at least two rows R1, R2 of fasteners that extend along the X axis and at least three columns C1, C2, C3 of fasteners that extend along the Y axis. In other aspects, any number of rows and columns of fasteners is provided. As will be described below the placement of the fasteners in one row R1, R2 along the Y axis may be offset from the fasteners in another row R1, R2 (or alternately the placement of the fasteners in one column C1, C2, C3 along the X axis may be offset from the fasteners in another column C1, C2, C3).

During the design process of, for example, the aircraft 902 certain design parameters are fixed, such as, the load profile F applied to the joint 300 and the number of fasteners 330. Other design parameters, such as, the structural component layup (e.g., number of plies and percent ply densities) and location of the fasteners 330 (e.g., with respect to the X and Y axes of the joint 300) are variable and are referred to in FIG. 2 as design variables. As will be described below, the aspects of the present disclosure use these fixed parameters and design variables in an iterative analysis, that includes structural design requirements and electromagnetic design requirements, to arrive at responses for the design variables such as a layup of the structural components 310, 320 that minimizes the weight (e.g., f(x;p)) of, for example, the structural components 310, 320 of the joint 300 and/or the effective resistance (e.g., c(x;p)) of the joint 300. In one aspect, the iterative analysis continues until there is a convergence on the minimized values of, for example, weight and effective resistance, as determined by the analysis sensitivities which in one aspect are an amount of change between each of the values between iterations as determined by, for example, the gradients of the responses (e.g., $\nabla f(x;p)$ and $\nabla c(x;p)$).

It is one aspect of the present disclosure to determine an arrangement of the fasteners that will direct the electrical current along a predetermined path along, for example, the skin 902S of the aircraft 902 (FIG. 9). To account for electromagnetic effects in the iterative analysis performed by the controller 120 (FIG. 1) and determine the arrangement of the fasteners the electrical resistance of the joint 300 (including the structural components 310, 320) is calculated.

Referring now to FIG. 4, with respect to the electromagnetic resistance of the joint 300, there are a number of paths the electric current can flow with respect to the fasteners 330. In FIG. 4 only two fasteners 330A, 330D are illustrated for exemplary purposes with a 0° angle between the fasteners 330A, 330D. In this example, there are about 7 electrical connections/paths between the fasteners 330A, 330D along which electrical current can flow. It is noted that the electrical current can only flow in a direction (e.g., at an angle of 0°, 90°, +45° or −45°) of the fibers 350F of one or more plies 350 of the structural components 310, 320. For example, current can flow between fasteners 330A, 330D through point 401 (e.g., a 0° path), through knee point 402 (e.g., a path having 90° and −45° portions), through knee point 404 (e.g., a path having +45° and −45° portions), through knee point 403 (e.g., a path having +45° and 90° portions), through knee point 405 (e.g., a path having 90° and +45° portions), through knee point 407 (e.g., a path having −45° and +45° portions), through knee point 406 (e.g., a path having −45° and 90° portions). It is noted that the paths where the flow of electrical current changes direction is referred to as having a knee point 402-407 where, as described herein, a knee resistance is accounted for in the iterative analysis performed by the controller 120 (FIG. 1). Where two fasteners are aligned at an angle of 0°, 90°, +45° or −45°, then the most paths that the resistance could travel is about seven (7) different paths which are illustrated in FIG. 4. If the two fasteners are not aligned at either an angle of 0°, 90°, +45° or −45°, then the most paths that the electrical current could travel is about twelve (12) different paths with twelve (12) knee points where the flow of electoral current changes direction.

Referring to FIG. 5, an example, of electrical current paths is illustrated with six (6) fasteners 330A, 330B, 330C, 330D, 330E, 330F is shown for exemplary purposes. In this example, there are about fifteen (15) different paths the electrical current can take. For example, if the source of electrical current originates at fastener 330C then the current can flow to either one of fasteners 330F, 330B, 330E, 330A, 330D. From fastener 330F the current can flow to one of either fasteners 330B, 330E, 330A, 330D. From fastener 330B the current can flow to one of either 330E, 330A, 330D. From fastener 330E the current can flow to one of either fasteners 330A, 330D. From fastener 330A the current can flow to fastener 330D. You can never go back to the fastener you started at previously because of the way that current flows.

The electrical resistance of the of the different current paths between the fasteners 330 is averaged to determine an optimal resistance using the equation $$R_{AVG} = \frac{1}{k}\left(\sum_{i=1}^{k} R_{eff_i}\right) \quad [1]$$

where k is the number of paths the current takes between fasteners. For example, referring to FIG. 4, if current flows from fastener 330A to fastener 330D through knee points 402 and 404 there are three paths k1, k2, k3 (e.g., k=3) that the current passes through. $R_{eff}$ is the effective resistance. The effective resistance $R_{eff}$ is determined by using the equation $$R_{eff} \approx \rho_j \left[\sum_{j=1}^{n}\left(\frac{L_j}{n(\theta_j)\eta_j\Delta_j D}\right)^{-1}\right]^{-1} + \left[\sum_{j=1}^{n}(R_{Knee_j})^{-1}\right]^{-1} \quad [2]$$

where $\rho_j$ is the electrical resistivity of the structural component fibers 350F, $L_j$ is the path length to the nearest ground, $n(\theta_j)$ is the number of plies in the $\theta_j$ direction, $\theta_j$ is the direction of the fibers 350F (e.g., 0°, 90°, +45° or −45°), $\eta_j$ is the cross-sectional fiber 350F density, $\Delta_j$ is the ply thickness, D is the diameter of the fasteners 330, $R_{Knee_j}$ is the resistance to go through the knee point 402-407. It is noted that the first inverse in equation [2] is due to the resistance in a parallel circuit and the sum is due to the resistance in a series circuit. The second inverse in equation [2] is due to the resistance in a parallel circuit.

Referring again to FIG. 5, during the iterative analysis the locations of the fasteners 330 are adjusted to optimize the resistance between the fasteners 330. For example, the pitch P between the rows and the offset a between the columns can be adjusted to change the angle α. Changing the offset a moves the row R2 of fasteners 330D, 330E, 330F in, for example, the Y direction so that the fasteners 330D, 330E, 330F are respectively located along columns C3A, C2A, C1A, which are offset from columns C3, C2, C1 by the distance of the offset a. In one aspect, changing the pitch P and the offset a affects the value of $R_{knee}$ (e.g., as the distance between the fasteners is changed the resistance between the fasteners through the knees increases or decreases) and ultimately affects the value $R_{AVG}$ in that the pitch P and the offset a are used to determine the value of $L_j$ in equation [2]

above. In one aspect, the number of plies 350 and the orientation of the fibers 350F in the ply stackup are changed during the iterative analysis where changing the number of plies 350 and the fiber 350F orientation affects the value of $R_{eff}$ and ultimately affects the value of $R_{AVG}$. In one aspect, one or more of the locations of the fasteners 330, the number of plies 350 and the orientation of the fibers 350F are changed during the iterative analysis to minimize $R_{AVG}$ as will be described below.

Referring now to FIGS. 1, 3A, 3B, 6 and 7 an exemplary process for determining at least a fastener 330 position configuration on a composite skin 902S of, for example, an aircraft will be described in accordance with the aspects of the present disclosure. In one aspect the fixed parameters and initial values for the design variables are input to the modeling module 122 in any suitable manner such as through user interface 110. In one aspect one or more of the load profile F is provided (FIG. 7, Block 700); the ply stackup(s) for the structural components 310, 320 (see FIGS. 3A and 3B), including an initial number of plies and fiber orientations of the plies, are provided (FIG. 7, Block 705); the joint parameters such as the number of fasteners, the pitch P between fastener rows R1, R2, the fastener diameter D and the column offset a are provided (FIG. 7, Block 710); and the electromagnetic effect parameters are provided (FIG. 7, Block 715) to the modeling module 122. In other aspects, any predetermined design criteria with respect to the structural components 310, 320, the fasteners 330 and the joint 300 are provided to the modeling module.

The modeling module 122 of the controller 120 receives the fixed and variable parameters (FIG. 7, Block 720) and imports, for example, the fixed and variable data, which in one aspect includes a number of plies 350 for the structural components 310, 320 to the parameterization module 124. The parameterization module 124 calculates, from for example the fixed and variable data, the margins of safety for the fasteners 330 and the structure of the joint 300 (FIG. 7, Block 725). The fixed and variable data, which in one aspect include the electromagnetic effect requirements and the percent ply densities, are imported to the electromagnetic effect module 125. The electromagnetic effect module 125 calculates, from for example the fixed and variable data, the average electromagnetic effect resistance $R_{AVG}$ using, for example, equations [1] and [2] above (FIG. 7, Block 735). The margins of safety and the average electromagnetic effect resistance $R_{AVG}$ are exported from the parameterization module 124 and the electromagnetic effect module 125 to the optimization nodule 123. The optimization module 123 determines a minimization of at least the average electromagnetic effect resistance $R_{AVG}$ using the margins of safety as constraints. In one aspect the optimization module 123 also determines a minimization of the weight of the structural components 310, 320 using, for example, the margins of safety as constraints. For example, the optimization module 123 compares a change in the values of the average electromagnetic effect resistance $R_{AVG}$ and/or the weight of the structural components 310, 320 between iterations. For example, in one aspect, after the first iteration the optimization module 123 changes one or more of the design variables (FIG. 7, Block 750) so that one or more of, for example, the pitch P between rows R1, R2, the offset a, the number of plies 350 and the direction of the fibers 350F is changed. The updated design variables are exported to the modeling module 122 and blocks 720 through 735 of FIG. 7 are repeated to produce updated margins of safety and an updated average electromagnetic effect resistance $R_{AVG}$. The optimization module 123 compares the updated average electromagnetic effect resistance $R_{AVG}$ with the previously calculated updated average electromagnetic effect resistance $R_{AVG}$ from the previous iteration, using the updated margins of safety as a constraint, and determines the sensitivity (e.g. the gradient or difference) between the updated and previous values. If the change between the updated and previous values is below a predetermined threshold, convergence of the average electromagnetic effect resistance $R_{AVG}$ (e.g., optimization of $R_{AVG}$) has occurred and the design data is output to, for example, the user interface 110 where the design data includes updated and optimized values for one or more of the design variables which include the pitch P between rows R1, R2 and the offset a of the fasteners 330. If there is no convergence of the average electromagnetic effect resistance $R_{AVG}$ value the optimization module 123 changes one or more of the design variables and blocks 720, 725, 735 and 750 of FIG. 7 are repeated until convergence occurs.

In one aspect, the parameterization module 124 calculates an updated ply stackup (which includes arranging the fiber orientations of the plies) based on, for example, an updated number of plies from the optimization module 123 (FIG. 7, Block 730). The parameterization module 124 calculates a weight of the structural components 310, 320 based on the updated ply stackup (FIG. 7, Block 740). The weight of the structural components 310, 320 is exported to the optimization module 123 which compares the weight of the structural components 310, 320 with a previously calculated weight of the structural components, with the margins of safety as a constraint. If the change between the updated and previous values for the weight of the structural components 310, 320 is below a predetermined threshold, convergence of the weight (e.g., optimization of the weight) has occurred and the design data is output to, for example, the user interface 110 where the design data includes updated and optimized values for one or more of the design variables which include the ply stackup. In one aspect, the percent ply densities from the updated ply stackup are imported by the electromagnetic effect module 125 and used to determine the updated average electromagnetic effect resistance $R_{AVG}$ in the manner described above where the electromagnetic effect resistance $R_{AVG}$ and the weight of the structural components are optimized in parallel substantially simultaneously.

In one aspect the exemplary process described herein is employed as noted above, in one aspect, to determine the fastener 330 position configuration with respect to the electromagnetic effect requirements during, for example, the preliminary design phase of an aircraft to minimize the electromagnetic resistance through the fastener pattern. In another aspect the exemplary process described herein is employed as noted above, in one aspect, to determine the fastener 330 position configuration and the layup of the structural components (e.g., of the skin 902S) with respect to the electromagnetic effect requirements during, for example, the preliminary design phase of an aircraft to minimize the electromagnetic resistance and ply thickness (e.g., a thickness of the layup) through the fastener pattern.

The disclosure and drawing figures describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, in some aspects of the disclosure, not all operations described herein need be performed.

Examples of the disclosure may be described in the context of an aircraft manufacturing and service method 800 as shown in FIG. 8 and an aircraft 902 as shown in FIG. 9. During pre-production, illustrative method 800 may include specification and design 804 of the aircraft 902 and material procurement 806 which in one aspect includes the determination of the fastener pattern and layup for the composite skin 902S of the aircraft 902. During production, component and subassembly manufacturing 808 and system integration 810 of the aircraft 902 take place. Thereafter, the aircraft 902 may go through certification and delivery 812 to be placed in service 814. While in service by a customer, the aircraft 902 is scheduled for routine maintenance and service 816 (which may also include modification, reconfiguration, refurbishment, and so on).

Processes of the illustrative method 800 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIGS. 3A and 9, the aircraft 902 produced by the illustrative method 800 may include an airframe 918 with a plurality of high-level systems and an interior 922. Examples of high-level systems, which are distributed throughout the aircraft, include one or more of a propulsion system 924, an electrical power system 926, a hydraulic system 928, and an environmental system 930. Any number of other systems may be included. In one aspect the aircraft 902 includes a first composite structural component, a second composite structural component and a plurality of fasteners 330A-330F joining the first composite structural component to the second composite structural component at a joint 300. The first and second composite structural components are in one aspect components of the aircraft skin 902S such as structural components 310, 320 described herein. The arrangement of the plurality of fasteners 330A-330F relative to each other being determined by the method described herein. Although an aerospace example is shown, the principles of the invention may be applied to other industries that consider electromagnetic effects through composite structures.

Apparatus and methods shown or described herein may be employed during any one or more of the stages of the manufacturing and service method 800. For example, components or subassemblies corresponding to component and subassembly manufacturing 808 may be fabricated or manufactured in a manner similar to components or subassemblies produced while the aircraft 902 is in service. Also, one or more aspects of the apparatus, method, or combination thereof may be utilized during the production states 808 and 810, for example, by substantially expediting assembly of or reducing the cost of an aircraft 902. For example, the aspects of the present disclosure reduce costs and reduce design times by foregoing repeated electromagnetic resistance testing when determining the composite skin 902S layup and fastener locations. Similarly, one or more aspects of the apparatus or method realizations, or a combination thereof, may be utilized, for example and without limitation, while the aircraft 902 is in service, e.g., operation, maintenance and service 816 such as when determining fastener positions and layup for repairing the composite skin 920S.

Different examples and aspects of the apparatus and methods are disclosed herein that include a variety of components, features, and functionality. It should be understood that the various examples and aspects of the apparatus and methods disclosed herein may include any of the components, features, and functionality of any of the other examples and aspects of the apparatus and methods disclosed herein in any combination, and all of such possibilities are intended to be within the spirit and scope of the present disclosure.

Many modifications and other examples of the disclosure set forth herein will come to mind to one skilled in the art to which the disclosure pertains having the benefit of the teachings presented in the foregoing descriptions and the associated drawings.

In one or more aspects of the present disclosure a method comprises receiving a joint parameter between at least two composite structural components, a ply stackup for each of the at least two composite structural components and an electromagnetic effect parameter in a controller; iteratively processing with the controller, the joint parameter and the ply stackup and outputting an optimized joint parameter based on at least a convergence of an electromagnetic effect resistance of the joint and the at least two composite structural components; and changing, with the controller, a value of one or more of the joint parameters and the ply stackup during the iterative processing to reach the convergence of the electromagnetic effect resistance.

In one or more aspects of the present disclosure the method further comprises iteratively processing with the controller, the joint parameter and the ply stackup and outputting an optimized ply stackup for each of the at least two composite structural components based on at least a convergence of the electromagnetic effect resistance.

In one or more aspects of the present disclosure the method further comprises outputting with the controller, the optimized ply stackup for each of the at least two composite structural components based on the convergence of the electromagnetic effect resistance and a convergence of a weight of the at least two composite structural components.

In one or more aspects of the present disclosure the method further comprises determining, with the controller, a joint margin of safety, where the joint margin of safety is a constraint in the determination of the optimized ply stackup.

In one or more aspects of the present disclosure the method further comprises outputting, with the controller, the optimized joint parameter based on the convergence of the electromagnetic effect resistance and a convergence of a weight of the at least two composite structural components.

In one or more aspects of the present disclosure the method further comprises determining, with the controller, a joint margin of safety for the joint, where the joint margin of safety is a constraint in the determination of the optimized joint parameters.

In one or more aspects of the present disclosure the method further comprises changing, with the controller, a fastener location in the joint parameter during the iterative processing to reach the convergence of the electromagnetic effect resistance.

In one or more aspects of the present disclosure the method further comprises changing, with the controller, one or more of a number of plies and a ply orientation of each of the at least two composite structural components during the iterative processing to reach the convergence of the electromagnetic effect resistance.

In one or more aspects of the present disclosure a method comprises receiving a joint parameter for a joint between at least two composite structural components, a load profile for the joint and an electromagnetic effect parameter in a controller; determining with the controller, a ply stackup for each of the at least two composite structural components; determining with the controller, an electromagnetic effect resistance of the joint and the at least two composite structural components; iteratively processing with the controller, the joint parameter and the ply stackup and outputting an optimized joint parameter based on at least a convergence of the electromagnetic effect resistance; and changing with the controller, a value of one or more of the joint parameter and the ply stackup during the iterative processing to reach the convergence of at least the electromagnetic effect resistance.

In one or more aspects of the present disclosure the method further comprises iteratively processing with the controller, the joint parameter and the ply stackup and outputting an optimized ply stackup for each of the at least two composite structural components based on at least a convergence of the electromagnetic effect resistance.

In one or more aspects of the present disclosure the method further comprises outputting with the controller, the optimized ply stackup for each of the at least two composite structural components based on the convergence of the electromagnetic effect resistance and a convergence of a weight of the at least two composite structural components.

In one or more aspects of the present disclosure the method further comprises determining, with the controller, a joint margin of safety, where the joint margin of safety is a constraint in the determination of the optimized ply stackup.

In one or more aspects of the present disclosure the method further comprises outputting, with the controller, the optimized joint parameter based on the convergence of the electromagnetic effect resistance and a convergence of a weight of the at least two composite structural components.

In one or more aspects of the present disclosure the method further comprises determining, with the controller, a joint margin of safety for the joint, where the joint margin of safety is a constraint in the determination of the optimized joint parameters.

In one or more aspects of the present disclosure the method further comprises changing, with the controller, a fastener location in the joint parameter during the iterative processing to reach the convergence of the electromagnetic effect resistance.

In one or more aspects of the present disclosure the method further comprises changing, with the controller, one or more of a number of plies and a ply orientation of each of the at least two composite structural components during the iterative processing to reach the convergence of the electromagnetic effect resistance.

In one or more aspects of the present disclosure a computer program product is provided. The computer program product having instructions stored on a non-transitory computer-readable storage medium which, when executed, configure a controller to: receive joint parameters for a joint between at least two composite structural components; receive a ply stackup for each of the at least two composite structural components; receive electromagnetic effect parameters; iteratively process the joint parameters, the ply stackup and the electromagnetic effect parameters and output optimized joint parameters based on at least a convergence of the electromagnetic effect parameters; and change a value of one or more of the joint parameters and the ply stackup during the iterative processing to reach the convergence of the electromagnetic effect parameters.

In one or more aspects of the present disclosure the joint parameters and the ply stackup are iteratively processed and an optimized ply stackup for each of the at least two composite structural components is output based on at least a convergence of the electromagnetic effect resistance.

In one or more aspects of the present disclosure the optimized ply stackup for each of the at least two composite structural components is output based on the convergence of the electromagnetic effect resistance and a convergence of a weight of the at least two composite structural components.

In one or more aspects of the present disclosure the optimized joint parameters are output based on the convergence of the electromagnetic effect resistance and a convergence of a weight of the at least two composite structural components.

In one or more aspects of the present disclosure an aircraft comprises a first composite structural component; a second composite structural component; and a plurality of fasteners joining the first composite structural component to the second composite structural component at a joint, an arrangement of the plurality of fasteners relative to each other being determined by receiving a joint parameter for the joint between the first and second composite structural components, a ply stackup for each of the first and second composite structural components and an electromagnetic effect parameter in a controller; iteratively processing with the controller, the joint parameter and the ply stackup and outputting an optimized joint parameter based on at least a convergence of an electromagnetic effect resistance of the joint and the at least two composite structural components; and changing, with the controller, a value of one or more of the joint parameter and the ply stackup during the iterative processing to reach the convergence of the electromagnetic effect resistance.

In one or more aspects of the present disclosure the ply stackup for each of the first and second composite structural components is determined by iteratively processing with the controller, the joint parameter and the ply stackup and outputting an optimized ply stackup for each of the first and second composite structural components based on at least a convergence of the electromagnetic effect resistance.

In one or more aspects of the present disclosure the ply stackup for each of the first and second composite structural components is determined by iteratively processing with the controller, the joint parameter and the ply stackup and outputting an optimized ply stackup for each of the first and second composite structural components based on the convergence of the electromagnetic effect resistance and a convergence of a weight of the first and second composite structural components.

In one or more aspects of the present disclosure the optimized joint parameter is output based on the convergence of the electromagnetic effect resistance and a convergence of a weight of the first and second composite structural components.

Therefore, it is to be understood that the disclosure is not to be limited to the specific embodiments disclosed and that modifications and other embodiments are intended to be included within the scope of the appended claims. Moreover, although the foregoing descriptions and the associated drawings describe example embodiments in the context of certain illustrative combinations of elements and/or functions, it should be appreciated that different combinations of elements and/or functions may be provided by alternative implementations without departing from the scope of the appended claims.

What is claimed is:

1. A method comprising:
    requesting an input for a joint parameter for a joint between at least two composite structural components, a ply stackup for each of the at least two composite structural components and an electromagnetic effect parameter on a user interface coupled to a controller;
    importing the joint parameter for the joint between the at least two composite structural components, the ply stackup for each of the at least two composite structural components, and the electromagnetic effect parameter into a modelling module and an electromagnetic effect module of the controller from the user interface, the electromagnetic effects module being configured to determine an average electromagnetic effect resistance of the joint based on all current paths between fasteners of the joint as provided by the ply stackup;
    importing the joint parameter and ply stackup from the modelling module to a parameterization module of the controller, where processed data from the parameterization module and the electromagnetic effect module is exported to an optimization module of the controller, where the optimization module processes the joint parameter and the ply stackup and iteratively exports an optimized joint structural configuration based on at least a convergence of the average electromagnetic effect resistance of the joint and the at least two composite structural components to the modelling module, where the optimized joint structural configuration includes a fastener pattern of the joint and a ply stackup configuration of the at least two composite structural components at the joint, the ply stackup configuration including an optimized stackup thickness based on at least the fastener pattern; and
    wherein the optimized joint structural configuration comprises a change in a value of one or more of the joint parameter and the ply stackup, where the changed values of the one or more of the joint parameter and the ply stackup are exported into the modelling module from the optimization module during the iterative processing to reach the convergence of the average electromagnetic effect resistance so as to effect, upon convergence, generation and output of design criteria to the user interface for physical construction of a physical composite structure so that a physical structural configuration of the joint between the at least two composite structural components forming the physical composite structure is based on the optimized joint structural configuration, wherein the optimized joint structural configuration with respect to electromagnetic effect requirements during design phase of an aircraft is to minimize the electromagnetic resistance and the ply stackup thickness.

2. The method of claim 1, further comprising:
    iteratively processing with the modelling module, the parameterization module, the electromagnetic effects module, and the optimization module, the joint parameter and the ply stackup and outputting an optimized ply stackup for each of the at least two composite structural components based on at least a convergence of the average electromagnetic effect resistance so as to effect construction of the physical composite structure so that a structural configuration of the ply stackup of each of the at least two composite structural components is based on the optimized ply stackup.

3. The method of claim 2, further comprising outputting with the controller to the user interface, the optimized ply stackup for each of the at least two composite structural components based on the convergence of the average electromagnetic effect resistance and a convergence of a weight of the at least two composite structural components.

4. The method of claim 2, further comprising determining, with the parameterization module, a joint margin of safety, where the joint margin of safety is a constraint in the determination of the optimized ply stackup.

5. The method of claim 1, further comprising outputting to the user interface, with the controller, the optimized joint parameter based on the convergence of the average electromagnetic effect resistance and a convergence of a weight of the at least two composite structural components.

6. The method of claim 1, further comprising determining, with the parameterization module, a joint margin of safety for the joint, where the joint margin of safety is a constraint in the determination of the optimized joint parameters.

7. The method of claim 1, further comprising changing, with the optimization module, a fastener location in the joint parameter during the iterative processing to reach the convergence of the average electromagnetic effect resistance.

8. The method of claim 1, further comprising changing, with the optimization module, one or more of a number of plies and a ply orientation of each of the at least two composite structural components during the iterative processing to reach the convergence of the average electromagnetic effect resistance.

9. A method of manufacturing a composite structure having a joint, the method comprising:
    importing, from a user interface, a joint parameter for the joint between at least two composite structural components, a load profile for the joint, and an electromagnetic effect parameter into a modelling module of a controller coupled to the user interface;
    determining with a parameterization module of the controller that is electronically coupled to the modelling module, from joint parameters imported to the parameterization module from the modelling module, a ply stackup for each of the at least two composite structural components;
    determining with the electromagnetic effect module of the controller that is electronically coupled to the modelling module, from joint parameters imported to the electromagnetic effect module from the modelling module and all current paths between fasteners of the joint as provided by the joint parameters, an average electromagnetic effect resistance of the joint and the at least two composite structural components;
    iteratively processing with an optimization module of the controller that is electronically coupled to both the parameterization module and the electromagnetic effect module, the joint parameter and the ply stackup based on data imported to the optimization module from the parameterization module and the electromagnetic effect module and outputting an optimized joint structural configuration based on at least a convergence of the average electromagnetic effect resistance, where the optimized joint structural configuration includes a fastener pattern of the joint and a ply stackup configuration of the at least two composite structural components at the joint, the ply stackup configuration including an optimized stackup thickness based on at least the fastener pattern; and wherein the optimized joint structural configuration comprises a change in a value of one or more of the joint parameter and the ply stackup, where the changed values of the one or more of the joint parameter and the ply stackup are iteratively exported to the modelling module from the optimization module during the iterative processing to reach the convergence of at least the average electromagnetic effect resistance so as to effect, upon convergence, generation and output of design criteria to the user interface for physical construction of a physical composite skin so that a physical structural configuration of a joint between the at least two composite structural components forming the physical composite skin is based on the optimized joint structural configuration, wherein the optimized joint structural configuration with respect to electromagnetic effect requirements during design phase of an aircraft is to minimize the electromagnetic resistance and the ply stackup thickness.

10. The method of claim 9, further comprising:
iteratively processing with the modelling module, the parameterization module, the electromagnetic effects module, and the optimization module, the joint parameter and the ply stackup and outputting an optimized ply stackup for each of the at least two composite structural components based on at least a convergence of the average electromagnetic effect resistance so as to effect construction of the physical composite skin so that a structural configuration of the ply stackup of each of the at least two composite structural components is based on the optimized ply stackup.

11. The method of claim 10, further comprising outputting with the controller to the user interface, the optimized ply stackup for each of the at least two composite structural components based on the convergence of the average electromagnetic effect resistance and a convergence of a weight of the at least two composite structural components.

12. The method of claim 10, further comprising determining, with the parameterization module, a joint margin of safety, where the joint margin of safety is a constraint in the determination of the optimized ply stackup.

13. The method of claim 9, further comprising outputting to the user interface, with the controller, the optimized joint parameter based on the convergence of the average electromagnetic effect resistance and a convergence of a weight of the at least two composite structural components.

14. The method of claim 9, further comprising determining, with the parameterization module, a joint margin of safety for the joint, where the joint margin of safety is a constraint in the determination of the optimized joint parameters.

15. The method of claim 9, further comprising changing, with the optimization module, a fastener location in the joint parameter during the iterative processing to reach the convergence of the average electromagnetic effect resistance.

16. The method of claim 9, further comprising changing, with the optimization module, one or more of a number of plies and a ply orientation of each of the at least two composite structural components during the iterative processing to reach the convergence of the average electromagnetic effect resistance.

17. A computer program product for facilitating the physical construction of a portion of an aircraft having a joint and at least two composite structural components, the computer program product having instructions stored on a non-transitory computer-readable storage medium which, when executed, configure a controller to:

request an input, through a user interface coupled to the controller, for joint parameters for the joint between the at least two composite structural components;
request an input, through a user interface coupled to the controller, for a ply stackup for each of the at least two composite structural components;
request an input, through a user interface coupled to the controller, for electromagnetic effect parameters;
import the joint parameters for the joint between the at least two composite structural components, the ply stackup for each of the at least two composite structural components, and the electromagnetic effect parameter into a modelling module and an electromagnetic effect module of the controller from the user interface;
import the joint parameter and ply stackup from the modelling module to a parameterization module of the controller, where processed data from the parameterization module and the electromagnetic effect module is exported to an optimization module of the controller, where the optimization module processes the joint parameters, the ply stackup and the electromagnetic effect parameters and iteratively exports an optimized joint structural configuration based on at least a convergence of the electromagnetic effect parameters to the modelling module, where the optimized joint structural configuration includes a fastener pattern of the joint and a ply stackup configuration of the at least two composite structural components at the joint, the ply stackup configuration including an optimized stackup thickness based on at least the fastener pattern;
change, with the optimization module, a value of one or more of the joint parameters and the ply stackup exported to the modelling module during the iterative processing to reach the convergence of the electromagnetic effect parameters; and
generate and export design criteria from the optimization module to the user interface for the portion of the aircraft having the joint and the at least two composite structural components where the design criteria comprises the optimized joint structural configuration of the joint between the at least two composite structural components for effecting physical construction of the portion of the aircraft, where a physical structural configuration of the joint, of the portion of the aircraft, is based on the optimized joint structural configuration, wherein the optimized joint structural configuration with respect to electromagnetic effect requirements during design phase of an aircraft is to minimize the electromagnetic resistance and the ply stackup thickness.

18. The computer program product of claim 17, wherein the joint parameters and the ply stackup are iteratively processed with the modelling module, the parameterization module, the electromagnetic effects module, and the optimization module and an optimized ply stackup for each of the at least two composite structural components is output to the user interface based on at least a convergence of the average electromagnetic effect resistance, where a structural configuration of the ply stackup of each of the at least two composite structural components, based on the optimized ply stackup for each of the at least two composite structural components, is included in the generated design criteria for forming the at least two composite structural components.

19. The computer program product of claim 18, wherein the optimized ply stackup for each of the at least two composite structural components is output based on the convergence of the average electromagnetic effect resistance and a convergence of a weight of the at least two composite structural components.

20. The computer program product of claim 17, wherein the optimized joint parameters are output based on the convergence of the average electromagnetic effect resistance and a convergence of a weight of the at least two composite structural components.

21. A method of manufacturing a composite structure having a joint, the method comprising:
receiving a joint parameter for a joint between at least two composite structural components, a ply stackup for each of the at least two composite structural components and an electromagnetic effect parameter in a controller;
iteratively processing with the controller, the joint parameter and the ply stackup and outputting an optimized joint structural configuration based on at least a convergence of an electromagnetic effect resistance of the joint and the at least two composite structural components, where the optimized joint structural configuration includes a fastener pattern of the joint and a ply stackup configuration of the at least two composite structural components at the joint, the ply stackup configuration including an optimized stackup thickness based on at least the fastener pattern;
changing, with the controller, a value of one or more of the joint parameters and the ply stackup during the iterative processing to reach the convergence of the electromagnetic effect resistance; and
physically constructing a physical composite structure so that a physical structural configuration of the joint between the at least two composite structural components forming the physical composite structure is based on the optimized joint structural configuration, wherein the optimized joint structural configuration with respect to electromagnetic effect requirements during design phase of an aircraft is to minimize the electromagnetic resistance and the ply stackup thickness.

* * * * *